(12) United States Patent
Liu

(10) Patent No.: US 7,450,045 B2
(45) Date of Patent: Nov. 11, 2008

(54) DELTA-SIGMA ANALOG-TO-DIGITAL CONVERTER AND METHOD THEREOF

(75) Inventor: Yu-Ren Liu, Taoyuan County (TW)

(73) Assignee: ITE Tech. Inc., Hsinchu (TW)

( * ) Notice: Subject to any disclaimer, the term of this patent is extended or adjusted under 35 U.S.C. 154(b) by 119 days.

(21) Appl. No.: 11/538,063

(22) Filed: Oct. 3, 2006

(65) Prior Publication Data
US 2008/0024348 A1 Jan. 31, 2008

(30) Foreign Application Priority Data
Jul. 26, 2006 (TW) .............................. 95127244 A

(51) Int. Cl.
*H03M 3/00* (2006.01)
(52) U.S. Cl. ...................................... 341/143; 341/155
(58) Field of Classification Search ................. 341/143, 341/155, 144, 118, 120, 131
See application file for complete search history.

(56) References Cited

U.S. PATENT DOCUMENTS

| 5,196,850 | A | * | 3/1993 | Duffy et al. | .................... 341/76 |
| 5,248,972 | A | * | 9/1993 | Karema et al. | ............... 341/143 |
| 2005/0116849 | A1 | * | 6/2005 | Melanson et al. | ............ 341/143 |

* cited by examiner

*Primary Examiner*—Brian Young
(74) *Attorney, Agent, or Firm*—Jianq Chyun IP Office

(57) ABSTRACT

A Delta-Sigma analog-to-digital converter and a method thereof are provided. According to a non-overlapping clock signal, the Delta-Sigma analog-to-digital converter performs an integration process on the difference between a plurality of input signals and the corresponding feedback signals to generate an integrated signal. Then, according to a selecting signal, the integrated signal is selectively output. Afterward, according to a latch signal, the selectively output integrated signal is quantized and latched by only one quantizer, thereby generating a digital output signal correspondingly. Accordingly, by using only one quantizer, the present invention can have the same function as the prior art which uses a plurality of quantizers, thereby decreasing the occupied chip area.

18 Claims, 3 Drawing Sheets

DELTA-SIGMA ANALOG-TO-DIGITAL CONVERTER AND METHOD THEREOF

CROSS-REFERENCE TO RELATED APPLICATION

This application claims the priority benefit of Taiwan application serial no. 95127244, filed Jul. 26, 2006. All disclosure of the Taiwan application is incorporated herein by reference.

BACKGROUND OF THE INVENTION

1. Field of Invention

The present invention relates to a signal modulation technique. More particularly, the present invention relates to a device for converting an analog signal into a digital signal and a method thereof.

2. Description of Related Art

Among various signal modulation devices, Delta-Sigma analog-to-digital converters have advantages of low cost and high resolution, and are suitable for the production in the current low-voltage semiconductor industry. However, in a conventional multi-channel Delta-Sigma analog-to-digital converter, each channel has a quantizer, thus occupying a large chip area.

SUMMARY OF THE INVENTION

An objective of the present invention is to provide a double-channel Delta-Sigma analog-to-digital converter with only one quantizer.

Another objective of the present invention is to provide a multi-channel Delta-Sigma analog-to-digital converter with only one quantizer.

Still another objective of the present invention is to provide a Delta-Sigma analog-to-digital conversion method, wherein single signals can be quantized at a time in manner of time-division multiplex, thereby converting a plurality of analog signals into a plurality of digital signals.

According to an aspect of the present invention, a Delta-Sigma analog-to-digital converter is provided, which comprises a first integrating circuit, a second integrating circuit, a multiplexer, and a quantizer. The first integrating circuit performs an integration process on the difference between a first input signal and a first feedback signal to generate a first integrated signal according to a first clock signal and a second clock signal, wherein the first feedback signal is an analog signal corresponding to a first digital output signal, and the first clock signal and the second clock signal are non-overlapping clock signals. The second integrating circuit performs an integration process on the difference between a second input signal and a second feedback signal to generate a second integrated signal according to a third clock signal and a fourth clock signal, wherein the second feedback signal is an analog signal corresponding to a second digital output signal, and the third clock signal and the fourth clock signal are non-overlapping clock signals. The multiplexer is coupled to the first integrating circuit and the second integrating circuit, and outputs the first integrated signal or the second integrated signal according to a selecting signal. The quantizer coupled to the multiplexer, the first integrating circuit, and the second integrating circuit respectively quantizes and latches the first integrated signal and the second integrated signal output by the multiplexer according to a first latch signal and a second latch signal, so as to generate the first digital output signal and the second digital output signal.

According to an embodiment of the present invention, the first clock signal, the third clock signal, the first latch signal, and the second latch signal are non-overlapping clock signals. The time sequence of the selecting signal allows the multiplexer to output the first integrated signal in the duty cycle of the first clock signal and to output the second integrated signal in the duty cycle of the third clock signal, and the first latch signal is valid after the falling edge of the first clock signal and the second latch signal is valid after the falling edge of the third clock signal, such that the quantizer periodically quantizes and latches the first integrated signal and the second integrated signal in sequence.

According to an embodiment of the present invention, the multiplexer comprises a first select switch and a second select switch. The first select switch and the second select switch both have a first end, a second end, and a control end. The first end of the first select switch receives the first integrated signal, the second end of the first select switch is coupled to the input of the quantizer, and the control end of the first select switch receives the first clock signal. The first select switch is turned on in the duty cycle of the first clock signal. The first end of the second select switch receives the second integrated signal, the second end of the second select switch is coupled to the input of the quantizer, and the control end of the second select switch receives the third clock signal. The second select switch is turned on in the duty cycle of the third clock signal.

According to an embodiment of the present invention, the first integrating circuit comprises a digital-to-analog converter and one or more switched-capacitor integrator(s). The digital-to-analog converter is coupled to the quantizer, so as to convert the first digital output signal into the first feedback signal. The switched-capacitor integrator has a first input end, a second input end, and an output end. The switched-capacitor integrator comprises a first switch, a second switch, a first capacitor, a third switch, a fourth switch, an operational amplifier, and a second capacitor. The first, second, third and fourth switches all have a first end, a second end, and a control end. The first capacitor and the second capacitor both have a first end and a second end. When the first integrating circuit comprises only one switched-capacitor integrator, the first input end receives the first input signal, the second input end receives the first feedback signal, and an integration process is performed on the difference between the first input signal and the first feedback signal to output the first integrated signal through the output end. The first end of the first switch is the first input end of the switched-capacitor integrator and the control end of the first switch receives the first clock signal. The first switch is turned on in the duty cycle of the first clock signal. The first end of the second switch is the second input end of the switched-capacitor integrator and the control end of the second switch receives the second clock signal. The second switch is turned on in the duty cycle of the second clock signal. The first end of the first capacitor is coupled to the second end of the first switch and the second end of the second switch. The first end of the third switch is coupled to the second end of the first capacitor, the second end of the third switch is coupled to the ground potential, and the control end of the third switch receives the first clock signal. The third switch is turned on in the duty cycle of the first clock signal. The first end of the fourth switch is coupled to the second end of the first capacitor and the control end of the fourth switch receives the second clock signal. The fourth switch is turned on in the duty cycle of the second clock signal. The operational amplifier has a positive input end, a negative input end, and an output end. The positive input end of the operational amplifier is grounded and the negative input end of the operational amplifier is coupled to the second end of the fourth switch. The first end of the second capacitor is coupled to the negative input end of the operational amplifier, and the second end of the second capacitor is coupled to the output end of the operational amplifier. When the first integrating circuit comprises a plurality of switched-capacitor integrators, the first input end of the first switched-capacitor integrator receives the first input signal and the first input end of another integrator is coupled to the output end of the preceding switched-capacitor integrator, and the second input end receives the first feedback signal. Each of the switched-capacitor integrators performs an integration process on the corresponding difference between the signals of the first input end and the second input end and outputs through the output end. The output end of the last switched-capacitor integrator outputs the first integrated signal. As for any one of the odd-numbered switch-capacitor integrators, the first end of the first switch is the first input end of the switched-capacitor integrator and the control end of the first switch receives the first clock signal. The first switch is turned on in the duty cycle of the first clock signal. The first end of the second switch is the second input end of the switched-capacitor integrator and the control end of the second switch receives the second clock signal. The second switch is turned on in the duty cycle of the second clock signal. The first end of the first capacitor is coupled to the second end of the first switch and the second end of the second switch. The first end of the third switch is coupled to the second end of the first capacitor, the second end of the third switch is coupled to the ground potential, and the control end of the third switch receives the first clock signal. The third switch is turned on in the duty cycle of the first clock signal. The first end of the fourth switch is coupled to the second end of the first capacitor and the control end of the fourth switch receives the second clock signal. The fourth switch is turned on in the duty cycle of the second clock signal. The operational amplifier has a positive input end, a negative input end, and an output end. The positive input end of the operational amplifier is grounded and the negative input end of the operational amplifier is coupled to the second end of the fourth switch. The first end of the second capacitor is coupled to the negative input end of the operational amplifier, and the second end of the second capacitor is coupled to the output end of the operational amplifier. As for any one of the even-numbered switch-capacitor integrators, the first end of the first switch is the first input end of the switched-capacitor integrator and the control end of the first switch receives the second clock signal. The first switch is turned on in the duty cycle of the second clock signal. The first end of the second switch is the second input end of the switched-capacitor integrator and the control end of the second switch receives the first clock signal. The second switch is turned on in the duty cycle of the first clock signal. The first end of the first capacitor is coupled to the second end of the first switch and the second end of the second switch. The first end of the third switch is coupled to the second end of the first capacitor, the second end of the third switch is coupled to the ground potential, and the control end of the third switch receives the second clock signal. The third switch is turned on in the duty cycle of the second clock signal. The first end of the fourth switch is coupled to the second end of the first capacitor and the control end of the fourth switch receives the first clock signal. The fourth switch is turned on in the duty cycle of the first clock signal. The operational amplifier has a positive input end, a negative input end, and an output end. The positive input end of the operational amplifier is grounded and the negative input end of the operational amplifier is coupled to the second end of the fourth switch. The first end of the second capacitor is coupled to the negative input end of the operational amplifier and the second end of the second capacitor is coupled to the output end of the operational amplifier.

According to an embodiment of the present invention, the second integrating circuit comprises a digital-to-analog converter and one or more switched-capacitor integrator(s). The digital-to-analog converter is coupled to the quantizer, so as to convert the second digital output signal into the second feedback signal. The switched-capacitor integrator has a first input end, a second input end, and an output end. The switched-capacitor integrator comprises a first switch, a second switch, a first capacitor, a third switch, a fourth switch, an operational amplifier, and a second capacitor. The first, second, third, and fourth switches all have a first end, a second end, and a control end. The first capacitor and the second capacitor both have a first end and a second end. When the second integrating circuit comprises only one switched-capacitor integrator, the first input end receives the second input signal, the second input end receives the second feedback signal, and an integration process is performed on the difference between the second input signal and the second feedback signal to output the second integrated signal through the output end. The first end of the first switch is the first input end of the switched-capacitor integrator and the control end of the first switch receives the third clock signal. The first switch is turned on in the duty cycle of the third clock signal. The first end of the second switch is the second input end of the switched-capacitor integrator and the control end of the second switch receives the fourth clock signal. The second switch is turned on in the duty cycle of the fourth clock signal. The first end of the first capacitor is coupled to the second end of the first switch and the second end of the second switch. The first end of the third switch is coupled to the second end of the first capacitor, the second end of the third switch is coupled to the ground potential, and the control end of the third switch receives the third clock signal. The third switch is turned on in the duty cycle of the third clock signal. The first end of the fourth switch is coupled to the second end of the first capacitor and the control end of the fourth switch receives the fourth clock signal. The fourth switch is turned on in the duty cycle of the fourth clock signal. The operational amplifier has a positive input end, a negative input end, and an output end. The positive input end of the operational amplifier is grounded and the negative input end of the operational amplifier is coupled to the second end of the fourth switch. The first end of the second capacitor is coupled to the negative input end of the operational amplifier and the second end of the second capacitor is coupled to the output end of the operational amplifier. When the second integrating circuit comprises a plurality of switched-capacitor integrators, the first input end of the first switched-capacitor integrator receives the second input signal and the first input end of another integrator is coupled to the output end of the preceding switched-capacitor integrator, and the second input end receives the second feedback signal. Each of the switched-capacitor integrators performs an integration process on the corresponding difference between the signals of the first input end and the second input end and outputs through the output end. The output end of the last switched-capacitor integrator outputs the second integrated signal. As for any one of the odd-numbered switch-capacitor integrators, the first end of the first switch is the first input end of the switched-capacitor integrator and the control end of the first switch receives the third clock signal. The first switch is turned on in the duty cycle of the third clock signal. The first end of the second switch is the second input end of the switched-capacitor integrator and the control end of the second switch receives the fourth clock signal. The second switch is turned on in the duty cycle of the fourth clock signal. The first end of the first capacitor is coupled to the second end of the first switch and the second end of the second switch. The first end of the third switch is coupled to the second end of the first capacitor, the second end of the third switch is coupled to the ground potential, and the control end of the third switch receives the third clock signal. The third switch is turned on in the duty cycle of the third clock signal. The first end of the fourth switch is coupled to the second end of the first capacitor and the control end of the fourth switch receives the fourth clock signal. The fourth switch is turned on in the duty cycle of the fourth clock signal. The operational amplifier has a positive input end, a negative input end, and an output end. The positive input end of the operational amplifier is grounded and the negative input end of the operational amplifier is coupled to the second end of the fourth switch. The first end of the second capacitor is coupled to the negative input end of the operational amplifier and the second end of the second capacitor is coupled to the output end of the operational amplifier. As for any one of the even-numbered switch-capacitor integrators, the first end of the first switch is the first input end of the switched-capacitor integrator and the control end of the first switch receives the fourth clock signal. The first switch is turned on in the duty cycle of the fourth clock signal. The first end of the second switch is the second input end of the switched-capacitor integrator and the control end of the second switch receives the third clock signal. The second switch is turned on in the duty cycle of the third clock signal. The first end of the first capacitor is coupled to the second end of the first switch and the second end of the second switch. The first end of the third switch is coupled to the second end of the first capacitor, the second end of the third switch is coupled to the ground potential, and the control end of the third switch receives the fourth clock signal. The third switch is turned on in the duty cycle of the fourth clock signal. The first end of the fourth switch is coupled to the second end of the first capacitor and the control end of the fourth switch receives the third clock signal. The fourth switch is turned on in the duty cycle of the third clock signal. The operational amplifier has a positive input end, a negative input end, and an output end. The positive input end of the operational amplifier is grounded and the negative input end of the operational amplifier is coupled to the second end of the fourth switch. The first end of the second capacitor is coupled to the negative input end of the operational amplifier and the second end of the second capacitor is coupled to the output end of the operational amplifier.

According to an aspect of the present invention, a Delta-Sigma analog-to-digital converter is provided, which comprises a plurality of integrating circuits, a multiplexer, and a quantizer. Each of the integrating circuits performs an integration process on the difference between a plurality of input signals and a plurality of feedback signals to generate a plurality of integrated signals according to a corresponding first clock signal and second clock signal, wherein the feedback signals are analog signals corresponding to a plurality of digital output signals, and the first clock signal and the second clock signal of each of the integrating circuits are non-overlapping clock signals. The multiplexer is coupled to each of the integrating circuits and selectively outputs one of the integrated signals according to a selecting signal. The quantizer is coupled to the multiplexer and each integrating circuit and respectively quantizes and latches the integrated signals output by the multiplexer according to a plurality of latch signals corresponding to the first clock signal of each integrating circuit, so as to generate the digital output signals.

According to an embodiment of the present invention, the first clock signal and the latch signals of the integrating circuits are non-overlapping clock signals. The time sequence of the selecting signal allows the multiplexer to output the integrated signals in the duty cycle of the first clock signal, and the latch signals are valid after the falling edge of the first clock signal, such that the quantizer periodically quantizes and latches the integrated signals in sequence.

According to an embodiment of the present invention, the multiplexer comprises a plurality of select switches, each having a first end, a second end, and a control end. The first ends of the select switches correspondingly receive the integrated signals, the second ends of the select switches are coupled to the input of the quantizer, and the control ends of the select switches correspondingly receive the first clock signals. The select switches are turned on in the duty cycle of the first clock signals.

According to an embodiment of the present invention, each of the integrating circuit comprises a digital-to-analog converter and one or more switched-capacitor integrator(s). The digital-to-analog converter is coupled to the quantizer, so as to convert a digital output signal into a feedback signal. The switched-capacitor integrator has a first input end, a second input end, and an output end. The switched-capacitor integrator comprises a first switch, a second switch, a first capacitor, a third switch, a fourth switch, an operational amplifier, and a second capacitor. The first, second, third and fourth switches all have a first end, a second end, and a control end. The first capacitor and the second capacitor both have a first end and a second end. When each of the integrating circuit comprises only one switched-capacitor integrator, the first input end receives the input signal, the second input end receives the feedback signal, and an integration process is performed on the difference between the input signal and the feedback signal to output the integrated signal through the output end. The first end of the first switch is the first input end of the switched-capacitor integrator and the control end of the first switch receives the first clock signal. The first switch is turned on in the duty cycle of the first clock signal. The first end of the second switch is the second input end of the switched-capacitor integrator and the control end of the second switch receives the second clock signal. The second switch is turned on in the duty cycle of the second clock signal. The first end of the first capacitor is coupled to the second end of the first switch and the second end of the second switch. The first end of the third switch is coupled to the second end of the first capacitor, the second end of the third switch is coupled to the ground potential, and the control end of the third switch receives the first clock signal. The third switch is turned on in the duty cycle of the first clock signal. The first end of the fourth switch is coupled to the second end of the first capacitor and the control end of the fourth switch receives the second clock signal. The fourth switch is turned on in the duty cycle of the second clock signal. The operational amplifier has a positive input end, a negative input end, and an output end. The positive input end of the operational amplifier is grounded and the negative input end of the operational amplifier is coupled to the second end of the fourth switch. The first end of the second capacitor is coupled to the negative input end of the operational amplifier, and the second end of the second capacitor is coupled to the output end of the operational amplifier. When each of the integrating circuits comprises a plurality of switched-capacitor integrators, the first input end of the first switched-capacitor integrator receives one of the input signals and the first input end of another integrator is coupled to the output end of the preceding switched-capacitor integrator, and the second input end correspondingly receives one of the feedback signals. Each of the switched-capacitor integrators performs an integration process on the corresponding difference between the signals of the first input end and the second input end and outputs through the output end. The output end of the last switched-capacitor integrator outputs one of the integrated signals. As for any one of the odd-numbered switch-capacitor integrators, the first end of the first switch is the first input end of the switched-capacitor integrator and the control end of the first switch receives the first clock signal. The first switch is turned on in the duty cycle of the first clock signal. The first end of the second switch is the second input end of the switched-capacitor integrator and the control end of the second switch receives the second clock signal. The second switch is turned on in the duty cycle of the second clock signal. The first end of the first capacitor is coupled to the second end of the first switch and the second end of the second switch. The first end of the third switch is coupled to the second end of the first capacitor, the second end of the third switch is coupled to the ground potential, and the control end of the third switch receives the first clock signal. The third switch is turned on in the duty cycle of the first clock signal. The first end of the fourth switch is coupled to the second end of the first capacitor and the control end of the fourth switch receives the second clock signal. The fourth switch is turned on in the duty cycle of the second clock signal. The operational amplifier has a positive input end, a negative input end, and an output end. The positive input end of the operational amplifier is grounded and the negative input end of the operational amplifier is coupled to the second end of the fourth switch. The first end of the second capacitor is coupled to the negative input end of the operational amplifier, and the second end of the second capacitor is coupled to the output end of the operational amplifier. As for any one of the even-numbered switch-capacitor integrators, the first end of the first switch is the first input end of the switched-capacitor integrator and the control end of the first switch receives the second clock signal. The first switch is turned on in the duty cycle of the second clock signal. The first end of the second switch is the second input end of the switched-capacitor integrator and the control end of the second switch receives the first clock signal correspondingly. The second switch is turned on in the duty cycle of the first clock signal. The first end of the first capacitor is coupled to the second end of the first switch and the second end of the second switch. The first end of the third switch is coupled to the second end of the first capacitor, the second end of the third switch is coupled to the ground potential, and the control end of the third switch receives the second clock signal. The third switch is turned on in the duty cycle of the second clock signal. The first end of the fourth switch is coupled to the second end of the first capacitor and the control end of the fourth switch receives the first clock signal correspondingly. The fourth switch is turned on in the duty cycle of the first clock signal. The operational amplifier has a positive input end, a negative input end, and an output end. The positive input end of the operational amplifier is grounded and the negative input end of the operational amplifier is coupled to the second end of the fourth switch. The first end of the second capacitor is coupled to the negative input end of the operational amplifier, and the second end of the second capacitor is coupled to the output end of the operational amplifier.

According to an aspect of the present invention, a Delta-Sigma analog-to-digital conversion method is provided, and comprises the following steps. An integration process is performed on the difference between a plurality of input signals and a plurality of feedback signals to generate a plurality of integrated signals according to a plurality of groups of clock signals in which each group comprises a first clock signal and a second clock signal, wherein the feedback signals are analog signals corresponding to a plurality of digital output signals, and the first clock signal and the second clock signal in each group of clock signals are non-overlapping signals. The integrated signals are selectively output according to a selecting signal. The selectively output integrated signals are quantized and latched according to a plurality of latch signals respectively corresponding to the first clock signal in each group of clock signals, so as to generate the digital output signals. The first clock signal in each group of clock signals and the latch signals are non-overlapping clock signals. The corresponding integrated signal is selectively output in the duty cycle of the first clock signal in each group of clock signals. The corresponding latch signal is valid after the falling edge of the first clock signal in each group of clock signals. Moreover, each integrated signal is periodically quantized and latched in sequence.

The Delta-Sigma analog-to-digital converter of the present invention performs an integration process on the difference between the input signals and the feedback signals to generate the integrated signals according to the non-overlapping first clock signal and second clock signal. Further, the integrated signal is selectively output according to a selecting signal. Then, according to the latch signal corresponding to the first clock signal, only one quantizer is used to quantize and latch the selectively output integrated signal, so as to generate the digital output signal. The first clock signal and the latch signal are non-overlapping clock signals. The corresponding integrated signal is selectively output in the duty cycle of the first clock signal. Moreover, the corresponding latch signal is valid after the falling edge of the first clock signal, such that each integrated signal is periodically quantized and latched in sequence. Therefore, by using only one quantizer, the present invention can achieve the same function as the prior art which uses a plurality of quantizers, thereby decreasing the occupied chip area.

In order to make the aforementioned and other objectives, features and advantages of the present invention comprehensible, preferred embodiments accompanied with figures are described in detail below.

DESCRIPTION OF EMBODIMENTS

The exemplary embodiments of the present invention are illustrated in detail below with reference to the drawings. The aspects and features of the present invention become apparent with reference to the detailed illustration of the exemplary embodiments.

Figure 1:
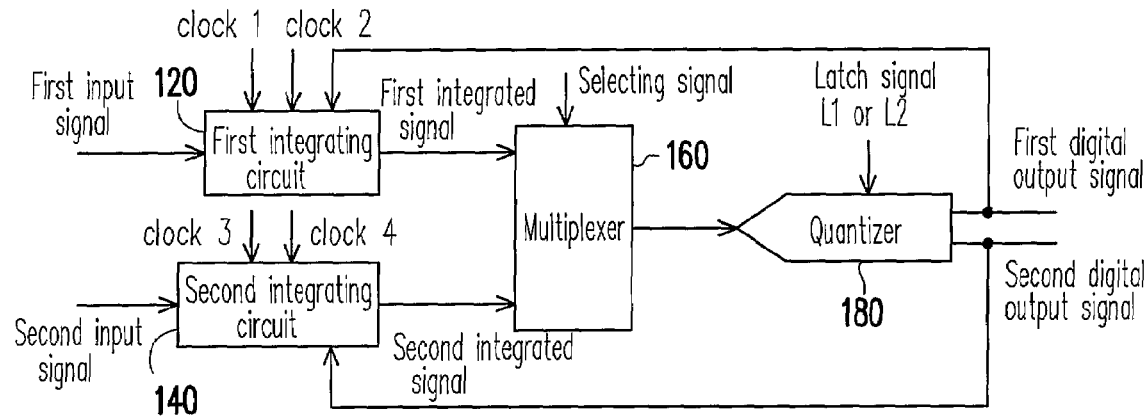
FIG. 1 is a block view of a double-channel Delta-Sigma analog-to-digital converter of the present invention.

FIG. 1 is a block view of a double-channel Delta-Sigma analog-to-digital converter 100, of the present invention. Referring to FIG. 1, the double-channel Delta-Sigma analog-to-digital converter 100 includes a first integrating circuit 120, a second integrating circuit 140, a multiplexer 160, and a quantizer 180. According to a first clock signal clock 1 and a second clock signal clock 2, the first integrating circuit 120 performs an integration process on the difference between a first input signal and a first feedback signal (not shown) to generate a first integrated signal, wherein the first feedback signal is an analog signal corresponding to a first digital output signal, and the first clock signal clock 1 and the second clock signal clock 2 are non-overlapping signals. According to a third clock signal clock 3 and a fourth clock signal clock 4, the second integrating circuit 140 performs an integration process on the difference between a second input signal and a second feedback signal (not shown) to generate a second integrated signal, wherein the second feedback signal is an analog signal corresponding to a second digital output signal, and the third clock signal clock 3 and the fourth clock signal clock 4 are non-overlapping signals. The multiplexer 160 is coupled to the first integrating circuit 120 and the second integrating circuit 140, so as to output the first integrated signal or the second integrated signal according to a selecting signal. The quantizer 180 is coupled to the multiplexer 160, the first integrating circuit 120, and the second integrating circuit 140. According to a first latch signal L1 and a second latch signal L2, the quantizer 180 respectively quantizes and latches the first integrated signal and the second integrated signal output by the multiplexer 160, so as to generate the first digital output signal and the second digital output signal.

In FIG. 1, the first clock signal clock 1, the third clock signal clock 3, the first latch signal L1, and the second latch signal L2 are non-overlapping clock signals. The time sequence of the selecting signal allows the multiplexer 160 to output the first integrated signal in the duty cycle of the first clock signal clock 1 and to output the second integrated signal in the duty cycle of the third clock signal clock 3, and the first latch signal L1 is valid after the falling edge of the first clock signal clock 1 and the second latch signal L2 is valid after the falling edge of the third clock signal clock 3, such that the quantizer 180 periodically quantizes and latches the first integrated signal and the second integrated signal in sequence.

Figure 3:
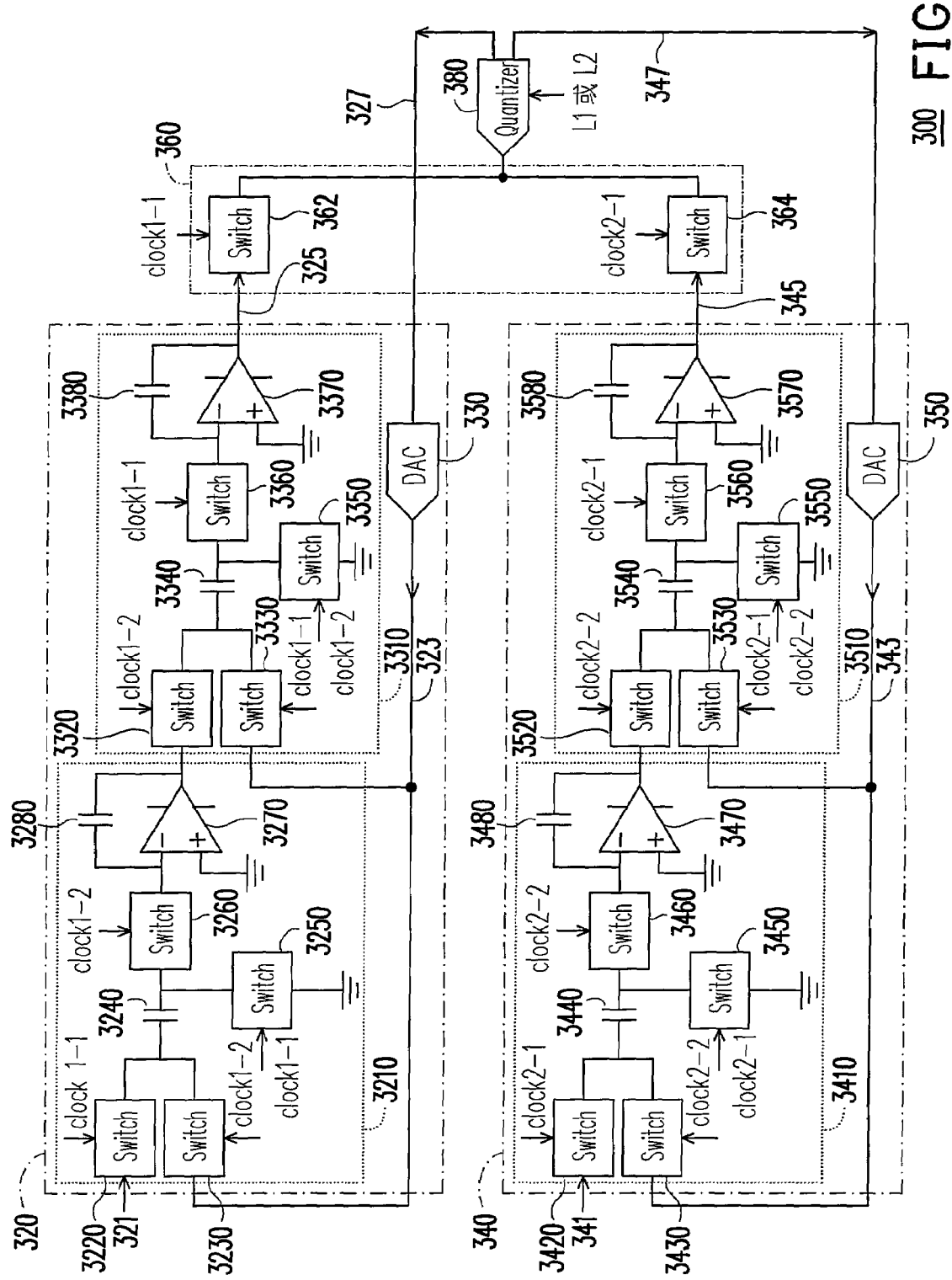
FIG. 3 is a circuit diagram of the double-channel Delta-Sigma analog-to-digital converter according to a preferred embodiment of the present invention.

FIG. 3 is a circuit diagram of a double-channel Delta-Sigma analog-to-digital converter 300 according to a preferred embodiment of the present invention. The double-channel Delta-Sigma analog-to-digital converter 300 includes a first integrating circuit 320, a second integrating circuit 340, a multiplexer 360, and a quantizer 380.

According to the preferred embodiment in FIG. 3, the first integrating circuit 320 includes a digital-to-analog converter 330 and switched-capacitor integrators 3210, 3310. The digital-to-analog converter 330 is coupled to the quantizer 380, so as to convert a first digital output signal 327 into a first feedback signal 323. The switched-capacitor integrator 3210 includes a first switch 3220, a second switch 3230, a first capacitor 3240, a third switch 3250, a fourth switch 3260, an operational amplifier 3270, and a second capacitor 3280. The switched-capacitor integrator 3310 includes a first switch 3320, a second switch 3330, a first capacitor 3340, a third switch 3350, a fourth switch 3360, an operational amplifier 3370, and a second capacitor 3380.

As shown in the figure, the switched-capacitor integrators 3210, 3310 both have a first input end, a second input end, and an output end. The first input end of the switched-capacitor integrator 3210 is the first end of the first switch 3220, for receiving a first input signal 321. The first input end of the switched-capacitor integrator 3310 is the first end of the first switch 3320, and is coupled to the output end of the operational amplifier 3270. The second input ends of the switched-capacitor integrators 3210, 3310 are the first ends of the second switches 3230, 3330 respectively, for receiving the first feedback signal 323. The switched-capacitor integrator 3210 performs an integration process on the difference between the first input signal 321 and the first feedback signal 323 and then outputs it to the switched-capacitor integrator 3310 through the output end of the operational amplifier 3270. Further, the switched-capacitor integrator 3310 performs an integration process on the difference between the output signal of the switched-capacitor integrator 3210 and the first feedback signal 323, and outputs a first integrated signal 325 through the output end of the operational amplifier 3370. In the switched-capacitor integrator 3210, the control end of the first switch 3220 receives a clock signal clock 1-1 and the first switch 3220 is turned on in the duty cycle of the clock signal clock 1-1. The control end of the second switch 3230 receives a clock signal clock 1-2, and the second switch 3230 is turned on in the duty cycle of the clock signal clock 1-2. The first end of the first capacitor 3240 is coupled to the second end of the first switch 3220 and the second end of the second switch 3230. The first end of the third switch 3250 is coupled to the second end of the first capacitor 3240, the second end of the third switch 3250 is coupled to the ground potential, and the control end of the third switch 3250 receives the clock signal clock 1-1. The third switch 3250 is turned on in the duty cycle of the clock signal clock 1-1. The first end of the fourth switch 3260 is coupled to the second end of the first capacitor 3240 and the control end of the fourth switch 3260 receives the clock signal clock 1-2. The fourth switch 3260 is turned on in the duty cycle of the clock signal clock 1-2. The positive input end of the operational amplifier 3270 is grounded, and the negative input end of the operational amplifier 3270 is coupled to the second end of the fourth switch 3260. The first end of the second capacitor 3280 is coupled to the negative input end of the operational amplifier 3270, and the second end of the second capacitor 3280 is coupled to the output end of the operational amplifier 3270. In the switched-capacitor integrator 3310, the control end of the first switch 3320 receives a clock signal clock 1-2 and the first switch 3320 is turned on in the duty cycle of the clock signal clock 1-2. The control end of the second switch 3330 receives a clock signal clock 1-1, and the second switch 3330 is turned on in the duty cycle of the clock signal clock 1-1. The first end of the first capacitor 3340 is coupled to the second end of the first switch 3320 and the second end of the second switch 3330. The first end of the third switch 3350 is coupled to the second end of the first capacitor 3340, the second end of the third switch 3350 is coupled to the ground potential, and the control end of the third switch 3350 receives the clock signal clock 1-2. The third switch 3350 is turned on in the duty cycle of the clock signal clock 1-2. The first end of the fourth switch 3360 is coupled to the second end of the first capacitor 3340 and the control end of the fourth switch 3360 receives the clock signal clock 1-1. The fourth switch 3360 is turned on in the duty cycle of the clock signal clock 1-1. The positive input end of the operational amplifier 3370 is grounded, and the negative input end of the operational amplifier 3370 is coupled to the second end of the fourth switch 3360. The first end of the second capacitor 3280 is coupled to the negative input end of the operational amplifier 3270, and the second end of the second capacitor 3280 is coupled to the output end of the operational amplifier 3270.

According to the preferred embodiment in FIG. 3, the second integrating circuit 340 includes a digital-to-analog converter 350 and switched-capacitor integrators 3410, 3510. The digital-to-analog converter 350 is coupled to the quantizer 380, so as to convert a second digital output signal 347 into a second feedback signal 343. The switched-capacitor integrator 3410 includes a first switch 3420, a second switch 3430, a first capacitor 3440, a third switch 3450, a fourth switch 3460, an operational amplifier 3470, and a second capacitor 3480. The switched-capacitor integrator 3510 includes a first switch 3520, a second switch 3530, a first capacitor 3540, a third switch 3550, a fourth switch 3560, an operational amplifier 3570, and a second capacitor 3580. As shown in the figure, the switched-capacitor integrators 3410, 3510 both have a first input end, a second input end, and an output end. The first input end of the switched-capacitor integrator 3410 is the first end of the first switch 3420, for receiving a second input signal 341. The first input end of the switched-capacitor integrator 3510 is the first end of the first switch 3520, and is coupled to the output end of the operational amplifier 3470. The second input ends of the switched-capacitor integrators 3410, 3510 are the first ends of the second switches 3430, 3530 respectively, for receiving the second feedback signal 343. The switched-capacitor integrator 3410 performs an integration process on the difference between the second input signal 341 and the second feedback signal 343 and then outputs it to the switched-capacitor integrator 3510 through the output end of the operational amplifier 3470. The switched-capacitor integrator 3510 performs an integration process on the difference between the output signal of the switched-capacitor integrator 3410 and the second feedback signal 343, and outputs a second integrated signal 345 through the output end of the operational amplifier 3570. In the switched-capacitor integrator 3410, the control end of the first switch 3420 receives a clock signal clock 2-1 (i.e., the third clock signal in FIG. 1) and the first switch 3420 is turned on in the duty cycle of the clock signal clock 2-1. The control end of the second switch 3430 receives a clock signal clock 2-2 (i.e., the fourth clock signal in FIG. 1), and the second switch 3430 is turned on in the duty cycle of the clock signal clock 2-2. The first end of the first capacitor 3440 is coupled to the second end of the first switch 3420 and the second end of the second switch 3430. The first end of the third switch 3450 is coupled to the second end of the first capacitor 3440, the second end of the third switch 3450 is coupled to the ground potential, and the control end of the third switch 3450 receives the clock signal clock 2-1. The third switch 3450 is turned on in the duty cycle of the clock signal clock 2-1. The first end of the fourth switch 3460 is coupled to the second end of the first capacitor 3440 and the control end of the fourth switch 3460 receives the clock signal clock 2-2. The fourth switch 3460 is turned on in the duty cycle of the clock signal clock 2-2. The positive input end of the operational amplifier 3470 is grounded, and the negative input end of the operational amplifier 3470 is coupled to the second end of the fourth switch 3460. The first end of the second capacitor 3480 is coupled to the negative input end of the operational amplifier 3470, and the second end of the second capacitor 3480 is coupled to the output end of the operational amplifier 3470. In the switched-capacitor integrator 3510, the control end of the first switch 3520 receives a clock signal clock 2-2 and the first switch 3520 is turned on in the duty cycle of the clock signal clock 2-2. The control end of the second switch 3530 receives a clock signal clock 2-1, and the second switch 3530 is turned on in the duty cycle of the clock signal clock 2-1. The first end of the first capacitor 3540 is coupled to the second end of the first switch 3520 and the second end of the second switch 3530. The first end of the third switch 3550 is coupled to the second end of the first capacitor 3540, the second end of the third switch 3550 is coupled to the ground potential, and the control end of the third switch 3550 receives the clock signal clock 2-2. The third switch 3550 is turned on in the duty cycle of the clock signal clock 2-2. The first end of the fourth switch 3560 is coupled to the second end of the first capacitor 3540 and the control end of the fourth switch 3560 receives the clock signal clock 2-1. The fourth switch 3560 is turned on in the duty cycle of the clock signal clock 2-1. The positive input end of the operational amplifier 3570 is grounded, and the negative input end of the operational amplifier 3570 is coupled to the second end of the fourth switch 3560. The first end of the second capacitor 3580 is coupled to the negative input end of the operational amplifier 3570, and the second end of the second capacitor 3580 is coupled to the output end of the operational amplifier 3570.

According to the preferred embodiment in FIG. 3, the multiplexer 360 includes a first select switch 362 and a second select switch 364. The first end of the first select switch 362 is coupled to the output end of the operational amplifier 3370, for receiving the first integrated signal 325. The second end of the first select switch 362 is coupled to the input of the quantizer 380 and the control end of the first select switch 362 receives the clock signal clock 1-1. The first select switch 362 is turned on in the duty cycle of the clock signal clock 1-1. The first end of the second select switch 364 is coupled to the output end of the operational amplifier 3570, for receiving the second integrated signal 345. The second end of the second select switch 364 is coupled to the input of the quantizer 380 and the control end of the second select switch 364 receives the clock signal clock 2-1. The second select switch 364 is turned on in the duty cycle of the clock signal clock 2-1. According to the first latch signal L1 and the second latch signal L2, the quantizer 380 respectively quantizes and latches the first integrated signal 325 and the second integrated signal 345 output by the multiplexer 360, so as to generate the first digital output signal 327 and the second digital output signal 347.

In the embodiment in FIG. 3, the first integrating circuit 320 can include only one switched-capacitor integrator or more switched-capacitor integrators. When the first integrating circuit 320 includes only one switched-capacitor integrator, the first input end receives the first input signal, the second input end receives the first feedback signal, and an integration process is performed on the difference between the first input signal and the first feedback signal so as to output the first integrated signal through the output end. When the first integrating circuit 320 includes a plurality of switched-capacitor integrators, the first input end of the first switched-capacitor integrator receives the first input signal and the first input end of another integrator is coupled to the output end of the preceding switched-capacitor integrator, and the second input end receives the first feedback signal. Each of the switched-capacitor integrators performs an integration process on the corresponding difference between the signals of the first input end and the second input end and outputs through the output end, and the output end of the last switched-capacitor integrator outputs the first integrated signal. Further, the second integrating circuit 340 includes only one switched-capacitor integrator or more switched-capacitor integrators. When the second integrating circuit 340 includes only one switched-capacitor integrator, the first input end receives the second input signal, the second input end receives the second feedback signal, and an integration process is performed on the difference between the second input signal and the second feedback signal so as to generate the second integrated signal through the output end. When the second integrating circuit 340 includes a plurality of switched-capacitor integrators, the first input end of the first switched-capacitor integrator receives the second input signal and the first input end of another integrator is coupled to the output end of the preceding switched-capacitor integrator, and the second input end receives the second feedback signal. Each of the switched-capacitor integrators performs an integration process on the difference between the signals of the first input end and the second input end and outputs through the output end, and the output end of the last switched-capacitor integrator outputs the second integrated signal.

Figure 4:
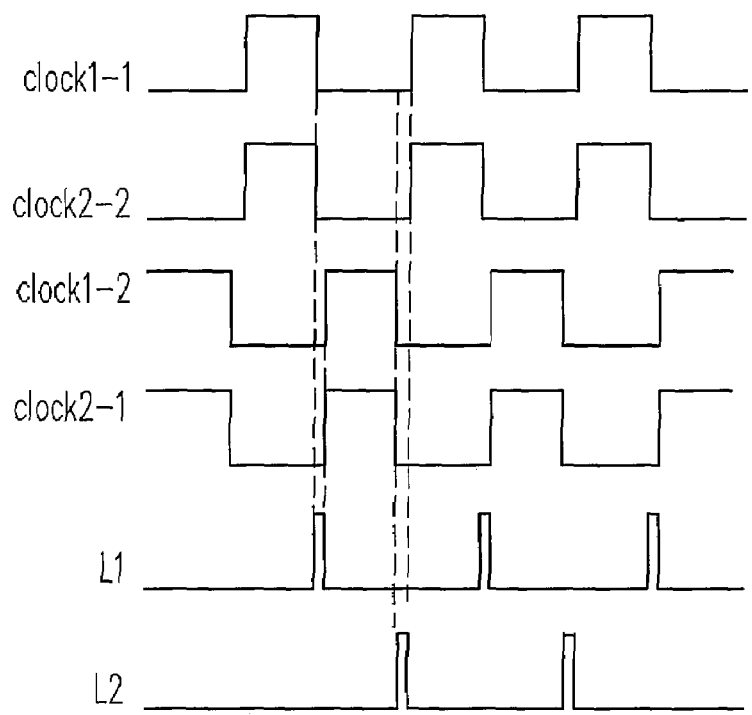
FIG. 4 is a time sequence chart of each clock signal and latch signal in FIG. 3.

The time sequence chart in FIG. 4 is obtained according to the circuit diagram of the Delta-Sigma analog-to-digital converter in FIG. 3. FIG. 4 is a time sequence chart of the clock signals clock 1-1, clock 1-2, clock 2-1, clock 2-2, the first latch signal L1, and the second latch signal L2 in FIG. 3. The clock signals clock 1-1 and clock 1-2 are non-overlapping signals, and the clock signals clock 2-1 and clock 2-2 are non-overlapping signals. Meanwhile, the clock signal clock 1-1, the clock signal clock 2-1, the first latch signal L1, and the second latch signal L2 are non-overlapping clock signals. Seen from FIG. 3, the multiplexer 360 outputs the first integrated signal 325 in the duty cycle of the clock signal clock 1-1 and outputs the second integrated signal 345 in the duty cycle of the clock signal clock 2-1. Moreover, the first latch signal L1 is valid after the falling edge of the clock signal clock 1-1, and the second latch signal L2 is valid after the falling edge of the clock signal clock 2-1, such that the quantizer 380 periodically quantizes and latches the first integrated signal 325 and the second integrated signal 345 in sequence. The time sequence chart of FIG. 4 can be obtained according to the above description.

Figure 2:
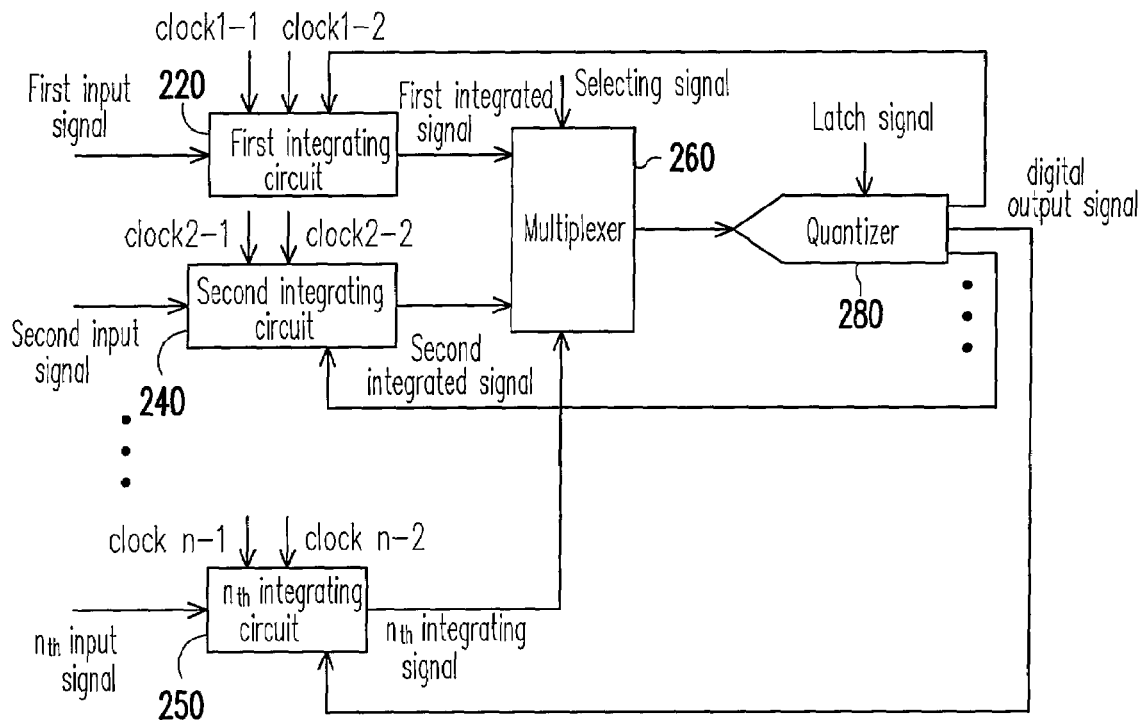
FIG. 2 is a block view of a multi-channel Delta-Sigma analog-to-digital converter of the present invention.

Seen from the above, the present invention can also be used in a multi-channel Delta-Sigma analog-to-digital converter. FIG. 2 is a block view of a multi-channel Delta-Sigma analog-to-digital converter 200 of the present invention. As shown in FIG. 2, the Delta-Sigma analog-to-digital converter 200 includes a plurality of integrating circuits 220, 240 . . . 250, a multiplexer 260, and a quantizer 280. In the Delta-Sigma analog-to-digital converter 200, according to a corresponding first clock signal and a second clock signal, each of the integrating circuits performs an integration process on the difference between a plurality of input signals and a plurality of feedback signals to generate a plurality of integrated signals, wherein the feedback signals are analog signals corresponding to a plurality of digital output signals, and the first clock signal and the second clock signal of each integrating circuit are non-overlapping clock signals. The multiplexer 260 is coupled to each integrating circuit and selectively outputs one of the integrated signals according to a selecting signal. The quantizer 280 is coupled to the multiplexer 260 and each integrating circuit, and respectively quantizes and latches the integrated signals output by the multiplexer according to a plurality of latch signals corresponding to the first clock signal of each integrating circuit, so as to generate the digital output signals. As the integrating circuit, multiplexer, and quantizer in FIG. 2 have almost the same structures and functions as those in FIG. 1, and the relation between the signals is also similar. Therefore, FIG. 2 is not described in detail herein for the convenience of illustration.

Figure 5:
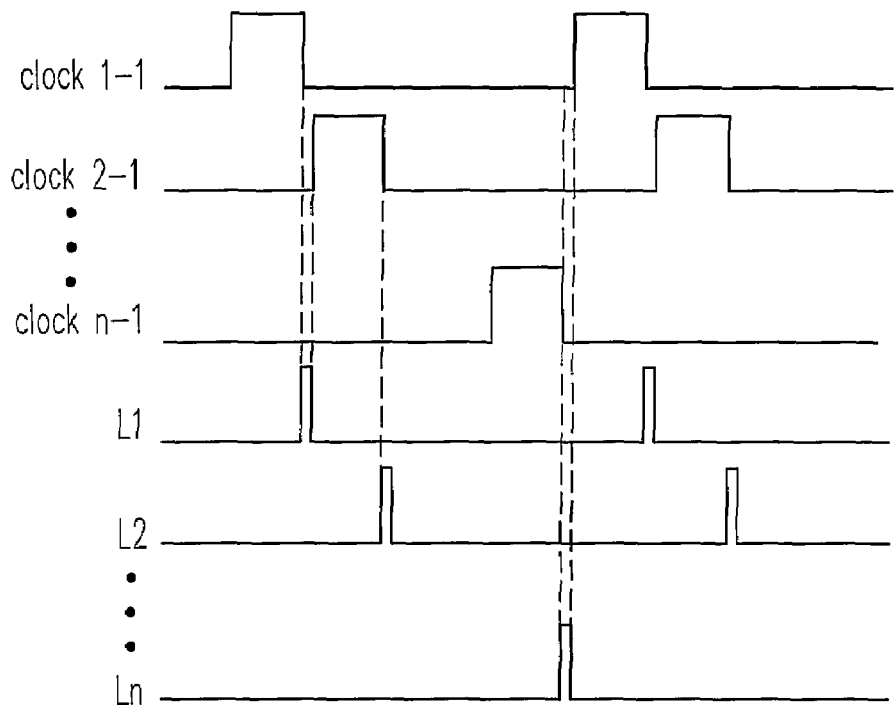
FIG. 5 is a time sequence chart of each first clock signal and the corresponding latch signal in FIG. 2.

Likewise, the time sequence chart of FIG. 5 is obtained according to the circuit diagram of the multi-channel Delta-Sigma analog-to-digital converter 200 of FIG. 2. FIG. 5 is a time sequence chart of each first clock signal and the corresponding latch signal in FIG. 2. Each first clock signal and the corresponding latch signal are non-overlapping clock signals. Seen from FIG. 2, the time sequence of the selecting signal allows the multiplexer 260 to correspondingly output the integrated signal in the duty cycle of each first clock signal and the corresponding latch signal is valid after the falling edge of each first clock signal, such that the quantizer 260 periodically quantizes and latches every integrated signal in sequence. The time sequence chart of FIG. 5 can be obtained according to the above description.

In view of the above, a Delta-Sigma analog-to-digital conversion method is further provided, and includes the following steps. According to a plurality of groups of clock signals in which each group includes a first clock signal and a second clock signal, an integration process is performed on the difference between the corresponding input signals and feedback signals to generate the integrated signals, wherein the feedback signals are analog signals corresponding to the digital output signals, and the first clock signal and the second clock signal in each group of clock signals are non-overlapping signals. One of the integrated signals is selectively output according to a selecting signal. According to the latch signals respectively corresponding to the first clock signal in each group of clock signals, the selectively output integrated signal is quantized and latched, so as to generate the digital output signals. The first clock signal in each group of clock signals and the latch signals are non-overlapping clock signals. The corresponding integrated signal is selectively output in the duty cycle of the first clock signal in each group of clock signals. The corresponding latch signal is valid after the falling edge of the first clock signal in each group of clock signals. Moreover, each integrated signal is periodically quantized and latched in sequence.

To sum up, by using only one quantizer, the Delta-Sigma analog-to-digital converter of the present invention, can achieve the same function as the prior art which uses a plurality of quantizers, thereby decreasing the occupied chip area.

Though the present invention has been disclosed above by the preferred embodiments, they are not intended to limit the present invention. Anybody skilled in the art can make some modifications and variations without departing from the spirit and scope of the present invention. Therefore, the protecting range of the present invention falls in the appended claims.

What is claimed is:

1. A Delta-Sigma analog-to-digital converter, comprising:
   a first integrating circuit, performing an integration process on the difference between a first input signal and a first feedback signal to generate a first integrated signal according to a first clock signal and a second clock signal, wherein the first feedback signal is an analog signal corresponding to a first digital output signal, and the first clock signal and the second clock signal are non-overlapping clock signals;
   a second integrating circuit, performing an integration process on the difference between a second input signal and a second feedback signal to generate a second integrated signal according to a third clock signal and a fourth clock signal, wherein the second feedback signal is an analog signal corresponding to a second digital output signal, and the third clock signal and the fourth clock signal are non-overlapping clock signals;
   a multiplexer, coupled to the first integrating circuit and the second integrating circuit, and outputting the first integrated signal or the second integrated signal according to a selecting signal; and
   a quantizer, coupled to the multiplexer, the first integrating circuit, and the second integrating circuit, wherein the quantizer respectively quantizes and latches the first integrated signal and the second integrated signal output by the multiplexer according to a first latch signal and a second latch signal, so as to generate the first digital output signal and the second digital output signal.

2. The Delta-Sigma analog-to-digital converter as cialmed in claim 1, wherein the first clock signal, the third clock signal, the first latch signal, and the second latch signal are non-overlapping clock signals; and the time sequence of the selecting signal allows the multiplexer to output the first integrated signal in the duty cycle of the first clock signal and to output the second integrated signal in the duty cycle of the third clock signal, and the first latch signal is valid after the falling edge of the first clock signal and the second latch signal is valid after the falling edge of the third clock signal, such that the quantizer periodically quantizes and latches the first integrated signal and the second integrated signal in sequence.

3. The Delta-Sigma analog-to-digital converter as claimed in claim 2, wherein the multiplexer comprises:
   a first select switch, having a first end receiving the first integrated signal, a second end coupled to the input of the quantizer, and a control end receiving the first clock signal, wherein the first select switch is turned on in the duty cycle of the first clock signal; and
   a second select switch, having a first end receiving the second integrated signal, a second end coupled to the input of the quantizer, and a control end receiving the third clock signal, wherein the second select switch is turned on in the duty cycle of the third clock signal.

4. The Delta-Sigma analog-to-digital converter as claimed in claim 1, wherein the first integrating circuit comprises:
   a digital-to-analog converter, coupled to the quantizer, for converting the first digital output signal into the first feedback signal; and
   a switched-capacitor integrator, having a first input end receiving the first input signal, a second input end receiving the first feedback signal, and an output end, wherein an integration process is performed on the difference between the first input signal and the first feedback signal to output the first integrated signal through the output end.

5. The Delta-Sigma analog-to-digital converter as claimed in claim 4, wherein the switched-capacitor integrator comprises:
   a first switch, having a first end being the first input end of the switched-capacitor integrator, a second end, and a control end receiving the first clock signal, wherein the first switch is turned on in the duty cycle of the first clock signal;
   a second switch, having a first end being the second input end of the switched-capacitor integrator, a second end, and a control end receiving the second clock signal, wherein the second switch is turned on in the duty cycle of the second clock signal;
   a first capacitor, having a first end and a second end, wherein the first end of the first capacitor is coupled to the second end of the first switch and the second end of the second switch;
   a third switch, having a first end coupled to the second end of the first capacitor, a second end coupled to the ground potential, and a control end receiving the first clock signal, wherein the third switch is turned on in the duty cycle of the first clock signal;
   a fourth switch, having a first end coupled to the second end of the first capacitor,
   a second end, and a control end receiving the second clock signal, wherein the fourth switch is turned on in the duty cycle of the second clock signal;
   an operational amplifier, having a positive input end grounded, a negative input end coupled to the second end of the fourth switch, and an output end; and
   a second capacitor, having a first end coupled to the negative input end of the operational amplifier and a second end coupled to the output end of the operational amplifier.

6. The Delta-Sigma analog-to-digital converter as claimed in claim 1, wherein the first integrating 6ircuit comprises:
   a digital-to-analog converter, coupled to the quantizer, for converting the first digital output signal into the first feedback signal; and
   a plurality of switched-capacitor integrators, each having a first input, end, a second input end, and an output end, wherein the first input end of the first switched-capacitor integrator receives the first input signal and the first input end of another switched-capacitor integrator is coupled to the output end of the preceding switched-capacitor integrator; the second input end of each of the switched-capacitor integrators receives the first feedback signal; each of the switched-capacitor integrators performs an integration process on the corresponding difference between the signals of the first input end and the second input end and outputs through the output end; and the output end of the last switched-capacitor integrator outputs the first integrated signal.

7. The Delta-Sigma analog-to-digital converter as claimed in claim 6, wherein any one of the odd-numbered switched-capacitor integrators comprises:
   a first switch, having a first end being the first input end of the switched-capacitor integrator, a second end, and a control end receiving the first clock signal, wherein the first switch is turned on in the duty cycle of the first clock signal;
   a second switch, having a first end being the second input end of the switched-capacitor integrator, a second end, and a control end receiving the second clock signal, wherein the second switch is turned on in the duty cycle of the second clock signal;
   a first capacitor, having a first end and a second end, wherein the first end of the first capacitor is coupled to the second end of the first switch and the second end of the second switch;
   a third switch, having a first end coupled to the second end of the first capacitor, a second end coupled to the ground potential, and a control end receiving the first clock signal, wherein the third switch is turned on in the duty cycle of the first clock signal;
   a fourth switch, having a first end coupled to the second end of the first capacitor,
   a second end, and a control end receiving the second clock signal, wherein the fourth switch is turned on in the duty cycle of the second clock signal;
   an operational amplifier, having a positive input end grounded, a negative input end coupled to the second end of the fourth switch, and an output end; and
   a second capacitor, having a first end coupled to the negative input end of the operational amplifier and a second end coupled to the output end of the operational amplifier,
   wherein any one of the even-numbered switched-capacitor integrators comprises:
   a first switch, having a first end being the first input end of the switched-capacitor integrator, a second end, and a control end receiving the second clock signal, wherein the first switch is turned on in the duty cycle of the second clock signal;
   a second switch, having a first end being the second input end of .the switched-capacitor integrator, a second end, and a control end receiving the first clock signal, wherein the second switch is turned on in the duty cycle of the first clock signal;

a first capacitor, having a first end and a second end, wherein the first end of the first capacitor is coupled to the second end of the first switch and the second end of the second switch;

a third switch, having a first end coupled to the second end of the first capacitor, a second end coupled to the ground potential, and a control end receiving the second clock signal, wherein the third switch is turned on in the duty cycle of the second clock signal;

a fourth switch, having a first end coupled to the second end of the first capacitor, a second end, and a control end. receiving the first clock signal, wherein the fourth switch is turned on in the duty cycle of the first clock signal;

an operational amplifier, having a positive input end grounded, a negative input end coupled to the second end of the fourth switch, and an output end; and a second capacitor, having a first end coupled to the negative input end of the operational amplifier and a second end coupled to the output end of the operational amplifier.

8. The Delta-Sigma analog-to-digital converter as claimed in claim 1, wherein the second integrating circuit comprises:

a digital-to-analog converter, coupled to the quantizer, for converting the second digital output signal into the second feedback signal; and a switched-capacitor integrator, having a first input end receiving the second input signal, a second input end receiving the second feedback signal, and an output end, wherein an integration process is performed on the difference between the second input signal and the second feedback signal to output the second integrated signal through the output end.

9. The Delta-Sigma analog-to-digital converter as claimed in claim 8, wherein the switched-capacitor integrator comprises:

a first switch, having a first end being the first input end of the switched-capacitor integrator, a second end, and a control end receiving the third clock signal, wherein the first switch is turned on in the duty cycle of the third clock signal;

a second switch, having a first end being the second input end of the switched-capacitor integrator, a second end, and a control end receiving the fourth clock signal, wherein the second switch is turned on in the duty cycle of the fourth clock signal;

a first capacitor, having a first end and a second end, wherein the first end of the first capacitor is coupled to the second end of the first switch and the second end of the second switch;

a third switch, having a first end coupled to the second end of the first capacitor, a second end coupled to the ground potential, and a control end receiving the third clock signal, wherein the third switch is turned on in the duty cycle of the third clock signal;

a fourth switch, having a first end coupled to the second end of the first capacitor, a second end, and a control end receiving the fourth clock signal, wherein the fourth switch is turned on in the duty cycle of the fourth clock signal;

an operational amplifier, having a positive input end grounded, a negative input end coupled to the second end of the fourth switch, and an output end; and a second capacitor, having a first end coupled to the negative input end of the operational amplifier and a second end coupled to the output end of the operational amplifier.

10. The Delta-Sigma analog-to-digital converter as claimed in claim 1, wherein the second integrating circuit comprises:

a digital-to-analog converter, coupled to the quantizer, for converting the second digital output signal into the second feedback signal; and a plurality of switched-capacitor integrators, each having a first input end, a second input end, and an output end, wherein the first input end of the first switched-capacitor integrator receives the second input signal and the first input end of another switched-capacitor integrators is coupled to the output end of the preceding switched-capacitor integrator; the second input end of each of the switched-capacitor integrators receives the second feedback signal; each of the switched-capacitor integrators performs an integration process on the corresponding difference between the signals of the first input end and the second input.end and outputs at the output end; and the output end of the last switched-capacitor integrator outputs the second integrated signal.

11. The Delta-Sigma analog-to-digital converter as claimed in claim 10, wherein any one of the odd-numbered switched-capacitor integrators comprises:

a first switch, having a first end being the first input end of the switched-capacitor integrator, a second end, and a control end receiving the third clock signal, wherein the first switch is turned on in the duty cycle of the third clock signal;

a second switch, having a first end being the second input end of the switched-capacitor integrator, a second end, and a control end receiving the fourth clock signal, wherein the second switch is turned on in the duty cycle of the fourth clock signal;

a first capacitor, having a first end and a second end, wherein the first end of the first capacitor is coupled to the second end of the first switch and the second end of the second switch;

a third switch, having a first end coupled to the second end of the first capacitor, a second end coupled to the ground potential, and a control end receiving the third clock signal, wherein the third switch is turned on in the duty cycle of the third clock signal;

a fourth switch, having a first end coupled to the second end of the first capacitor, a second end, and a control end receiving the fourth clock signal, wherein the fourth switch is turned on in the duty cycle of the fourth clock signal;

an operational amplifier, having a positive input end grounded, a negative input end coupled to the second end of the fourth switch, and an output end; and a second capacitor, having a first end coupled to the negative input end of the operational amplifier and a second end coupled to the output end of the operational amplifier, wherein any one of the even-numbered switched-capacitor integrators comprises:

a first switch, having a first end the first input end of the switched-capacitor integrator, a second end, and a control end receiving the fourth clock signal, wherein the first switch is turned on in the duty cycle of the fourth clock signal;

a second switch, having a first end being the second input end of the switched-capacitor integrator, a second end, and a control end receiving the third clock signal, wherein the second switch is turned on in the duty cycle of the third clock signal;

a first capacitor, having a first end and a second end, wherein the first end of the first capacitor is coupled to the second end of the first switch and the second end of the second switch;

a third switch, having a first end coupled to the second end of the first capacitor, a second end coupled to the ground potential, and a control end receiving the fourth clock signal, wherein the third switch is turned on in the duty cycle of the fourth clock signal;

a fourth switch, having a first end coupled to the second end of the first capacitor, a second end, and a control end receiving the third clock signal, wherein the fourth switch is turned on in the duty cycle of the third clock signal;

an operational amplifier, having a positive input end grounded, a negative input end coupled to the second end of the fourth switch, and an output end; and a second capacitor, having a first end coupled to the negative input end of the operational amplifier and a second end coupled to the output end of the operational amplifier.

12. A Delta-Sigma analog-to-digital converter, comprising:

a plurality of integrating circuits, each performing an integration process on the difference between a plurality of input signals and a plurality of feedback signals to generate a plurality of integrated signals according to a corresponding first clock signal and a second clock signal, wherein the feedback signals are analog signals corresponding to a plurality of digital output signals, and the first clock signal and the second clock signal of each of the integrating circuits are non-overlapping clock signals;

a multiplexer, coupled to the integrating circuits, wherein the multiplexer selectively outputs one of the integrated signals according to a selecting signal; and a quantizer, coupled to the multiplexer and the integrating circuits, wherein the quantizer respectively quantizes and latches the integrated signals output by the multiplexer according to a plurality of latch signals corresponding to the first clock signal of each of the integrating circuits, so as to generate the digital output signals;

wherein the first clock signals and the latch signals are non-overlapping signals, the time sequence of the selecting signal allows the multiplexer to output the integrated signals in the duty cycle of the first clock signals, and the latch signals are valid after the falling edges of the first clock signals, such that the quantizer periodically quantizes and latches the integrated signals in sequence.

13. The Delta-Sigma analog-to-digital converter as claimed in claim 12, wherein the multiplexer comprises:

a plurality of select switches, each having a first end receiving the integrated signals, a second end coupled to the input of the quantizer, and a control end receiving the corresponding first clock signals, wherein the select switches are turned on in the duty cycle of the first clock signals.

14. The Delta-Sigma analog-to-digital converter as claimed in claim 12, wherein each of the integrating circuits comprises: a digital-to-analog converter, coupled to the quantizer, for converting the digital output signals into the feedback signals; and a switched-capacitor integrator, having a first input end receiving the corresponding one of the input signals, a second input end receiving the corresponding one of the feedback signals, and an output end, wherein an integration process is performed on the difference between the input signal and the feedback signal to output one of the integrated signals through the output end.

15. The Delta-Sigma analog-to-digital converter as claimed in claim 14, wherein each of the switched-capacitor integrators comprises:

a first switch, having a first end being the first input end of the switched-capacitor integrator, a second end, and a control end receiving one of the first clock signals, wherein the first switch is turned on in the duty cycle of the first clock signal;

a second switch, having a first end being the second input end of the switched-capacitor integrator, a second end, and a control end receiving one of the second clock signals, wherein the second switch is turned on in the duty cycle of the secofid clock signal;

a first capacitor, having a first end and a second end, wherein the first end of the first capacitor is coupled to the second end of the first switch and the second end of the second switch;

a third switch, having a first end coupled to the second end of the first capacitor, a second end coupled to the ground potential, and a control end receiving the first clock signal, wherein the third switch is turned on in the duty cycle of the first clock signal;

a fourth switch, having a first end coupled to the second end of the first capacitor, a second end, and a control end receiving the second clock signal, wherein the fourth switch is turned on in the duty cycle of the second clock signal;

an operational amplifier, having a positive input end grounded, a negative input end coupled to the second end of the fourth switch, and an output end; and a second capacitor, having a first end coupled to the negative input of the operational amplifier and a second end coupled to the output end of the operational amplifier.

16. The Delta-Sigma analog-to-digital converter as claimed in claim 12, wherein each of the integrating circuits comprises:

a digital-to-analog converter, coupled to the quantizer, for converting the digital output signals into the feedback signals; and a plurality of switched-capacitor integrators, each having a first input end, a second input end, and an output end, wherein the first input end of the first switched-capacitor integrator receives one of the input signals and the first input end of another switched-capacitor integrator is coupled to the output end of the preceding switched-capacitor integrator; the second input end of each of the switched-capacitor integrators receives one of the feedback signals; each of the switched-capacitor integrators performs an integration process on the corresponding difference between the signals of the first input end and the second input end and outputs through the output end; and the output end of the last switched-capacitor integrator correspondingly outputs one of the integrated signals.

17. The Delta-Sigma analog-to-digital converter as claimed in claim 16, wherein any one of the odd-numbered switched-capacitor integrators comprises:

a first switch, having a first end being the first input end of the switched-capacitor integrator, a second end, and a control end receiving one of the first clock signals, wherein the first switch is turned on in the duty cycle of the first clock signal;

a second switch, having a first end being the second input end of the switched-capacitor integrator, a second end, and a control end receiving one of the second clock signals, wherein the second switch is turned on in the duty cycle of the second clock signal;

a first capacitor, having a first end and a second end, wherein the first end of the first capacitor is coupled to the second end of the first switch and the second end of the second switch;

a third switch, having a first end coupled to the second end of the first capacitor, a second end coupled to the ground potential, and a control end receiving the first clock signal, wherein the third switch is turned on in the duty cycle of the first clock signal;

a fourth switch, having a first end coupled to the second end of the first capacitor, a second end, and a control end receiving the second clock signal, wherein the fourth switch is turned on in the duty cycle of the second clock signal;

an operational amplifier, having a positive input end grounded, a negative input end coupled to the second end of the fourth switch, and an output end; and a second capacitor, having a first end coupled to the negative input end of the operational amplifier and a second end coupled to the output end of the operational amplifier, wherein any one of the even-numbered switched-capacitor integrators comprises:

a first switch, having a first end being the first input end of the switched-capacitor integrator, a second end, and a control end receiving one of the second clock signals, wherein the first switch is turned on in the duty cycle of the second clock signal;

a second switch, having a first end being the second input end of the switched-capacitor integrator, a second end, and a control end receiving one of the first clock signals, wherein the second switch is turned on in the duty cycle of the first clock signal;

a first capacitor, having a first end and a second end, wherein the first end of the first capacitor is coupled to the second end of the first switch and the second end of the second switch;

a third switch, having a first end coupled to the second end of the first capacitor, a second end coupled to the ground potential, and a control end receiving the second clock signal, wherein the third switch is turned on in the duty cycle of the second clock signal;

a fourth switch, having a first end coupled to the second end of the first capacitor, a second end, and a control end receiving the first clock signal, wherein the fourth switch is turned on in the duty cycle of the first clock signal;

an operational amplifier, having a positive input end grounded, a negative input end coupled to the second end of the fourth switch, and an output end; and a second capacitor, having a first end coupled to the negative input end of the operational amplifier and a second end coupled to the output end of the operational amplifier.

18. A Delta-Sigma analog-to-digital conversion method, comprising:

performing an integration process on the difference between a plurality of input signals and a plurality of feedback signals to generate a plurality of integrated signals according to a plurality of groups of clock signals in which each group comprises a first clock signal and a second clock signal, wherein the feedback signals are analog signals corresponding to a plurality of digital output signals, selectively outputting one of the integrated signals according to a selecting signal; and quantizing and latching the selectively output integrated signal according to a plurality of latch signals respectively corresponding to the first clock signal in each group of clock signals, so as to generate the digital output signals;

wherein the first clock signal in each group of clock signals and the latch signals are non-overlapping clock signals; the corresponding integrated signal is selectively output in the duty cycle of the first clock signal in each group of clock signals; the corresponding latch signal is valid after the falling edge of the first clock signal in each group of clock signals; and each of the integrated signals is periodically quantized and latched in sequence.

* * * * *